(12) United States Patent
Chow et al.

(10) Patent No.: US 8,872,360 B2
(45) Date of Patent: Oct. 28, 2014

(54) MULTIPLE-QUBIT WAVE-ACTIVATED CONTROLLED GATE

(71) Applicant: International Business Machines Corporation, Armonk, NY (US)

(72) Inventors: Jerry M. Chow, White Plains, NY (US); Jay M. Gambetta, Yorktown Heights, NY (US); Seth T. Merkel, Santa Monica, CA (US); Chad T. Rigetti, Brooklyn, NY (US); Matthias Steffen, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/833,413

(22) Filed: Mar. 15, 2013

(65) Prior Publication Data
US 2014/0264285 A1   Sep. 18, 2014

(51) Int. Cl.
| | | |
|---|---|---|
| *H01L 23/58* | (2006.01) | |
| *H01L 29/06* | (2006.01) | |
| *H01L 29/08* | (2006.01) | |
| *H01L 31/0256* | (2006.01) | |
| *H01L 39/22* | (2006.01) | |
| *H01L 23/34* | (2006.01) | |
| *H01L 49/00* | (2006.01) | |

(52) U.S. Cl.
CPC .................................... *H01L 49/006* (2013.01)
USPC ....... 257/798; 257/31; 257/723; 257/E29.168

(58) Field of Classification Search
USPC .............................. 257/31, 723, 798, E29.168
See application file for complete search history.

(56) References Cited

U.S. PATENT DOCUMENTS

| | | | |
|---|---|---|---|
| 6,900,456 B2 | 5/2005 | Blais et al. | |
| 7,459,673 B2 * | 12/2008 | Katori | 250/251 |
| 7,655,850 B1 * | 2/2010 | Ahn | 257/432 |
| 7,687,938 B2 * | 3/2010 | Bunyk et al. | 307/91 |
| 7,714,605 B2 | 5/2010 | Baumgardner et al. | |
| 7,830,695 B1 * | 11/2010 | Moon | 365/106 |
| 7,932,514 B2 | 4/2011 | Farinelli et al. | |
| 7,932,515 B2 * | 4/2011 | Bunyk | 257/31 |
| 8,148,715 B2 * | 4/2012 | Hollenberg et al. | 257/14 |
| 8,374,994 B2 * | 2/2013 | Roshen et al. | 706/62 |
| 8,642,998 B2 * | 2/2014 | Gambetta et al. | 257/31 |

(Continued)

FOREIGN PATENT DOCUMENTS

| | | |
|---|---|---|
| CN | 101868802 A | 12/2013 |
| EP | 1310910 A1 | 5/2003 |

OTHER PUBLICATIONS

M. Blaauboer et al., "An analytical decomposition protocol for optimal implementation of two-qubit entangling gates," Journal of Physics A, vol. 41, No. 39, 2008, 395307, 20 pages.

(Continued)

*Primary Examiner* — Ida M Soward
(74) *Attorney, Agent, or Firm* — Cantor Colburn LLP; Vazken Alexanian

(57) ABSTRACT

A device includes a housing, at least two qubits disposed in the housing and a resonator disposed in the housing and coupled to the at least two qubits, wherein the at least two qubits are maintained at a fixed frequency and are statically coupled to one another via the resonator, wherein energy levels |03> and |12> are closely aligned, wherein a tuned microwave signal applied to the qubit activates a two-qubit phase interaction.

16 Claims, 6 Drawing Sheets

(56) References Cited

U.S. PATENT DOCUMENTS

| | | | |
|---|---|---|---|
| 2005/0001209 A1 | 1/2005 | Hilton et al. | |
| 2007/0250280 A1 | 10/2007 | Beausoleil et al. | |
| 2009/0078931 A1 | 3/2009 | Berkley | |
| 2010/0133514 A1* | 6/2010 | Bunyk et al. | 257/31 |
| 2011/0114920 A1 | 5/2011 | Roshen et al. | |
| 2012/0187378 A1* | 7/2012 | Bonderson et al. | 257/31 |
| 2012/0319684 A1* | 12/2012 | Gambetta et al. | 324/304 |
| 2012/0326720 A1* | 12/2012 | Gambetta et al. | 324/307 |
| 2013/0196855 A1* | 8/2013 | Poletto et al. | 505/170 |

OTHER PUBLICATIONS

B. Kraus et al., "Optimal creation of entanglement using a two-qubit gate," Phys. Rev. A, vol. 63, Issue 6, 2001, 062309, 8 pages.

A. O. Niskanen et al., "Tunable coupling scheme for flux qubits at the optimal point," Phys. Rev. B, vol. 73, Issue 9, 2006, 094506, 8 pages.

C. Rigetti et al., "Fully microwave-tunable universal gates in superconducting qubits with linear couplings and fixed transition frequencies," Phys. Rev. B, vol. 81, Issue 13, 2010, 134507, 7 pages.

International Search Report and Written Opinion; International Application No. PCT/IB2014/058421; International Filing Date: Jan. 21, 2014; Date of mailing: Jun. 11, 2014; 14 pages.

* cited by examiner

MULTIPLE-QUBIT WAVE-ACTIVATED CONTROLLED GATE

FEDERAL RESEARCH STATEMENT

This invention was made with Government support under Contract No.: W911NF-10-1-0324 awarded by the U.S. Army. The Government has certain rights in this invention.

BACKGROUND

The present invention relates to quantum computing, and more specifically, to systems and methods for a two-qubit microwave-activated controlled phase gate.

Superconducting qubits have made considerable progress recently in experimental controls for generating a universal set of quantum gates for quantum computing. Analogous to how classical algorithms can be built from a universal logic gate, such as a NAND gate, all quantum algorithms can be constructed from a universal set of quantum gates. It has theoretically been proven that such a universal set includes arbitrary single qubit rotation gates and a two-qubit entangling gate. The quality of these gates are characterized by a metric known as gate fidelity, and how close this number comes to unity reflects how well the gate maps a complete set of input states to ideal output states.

The underlying qubit architecture determines the gates that can be practically implemented. For superconducting qubits, the single qubit gates are simple and a resolved issue; these are generated by shaped microwave pulses which are resonant with the frequencies corresponding to the qubit transitions and have resulted in gate fidelities better than 0.999. In contrast, there have been many different implementations of the entangling two-qubit gate, each with their own set of advantages and disadvantages. Some of these gates involve added circuit and control complexity for the qubit while others place stringent requirements on the integrity of different microwave control signals applied. To date, none of these approaches provide the same ease of control as the shaped microwave single qubit gates.

SUMMARY

Exemplary embodiments include a device, including a housing, at least two qubits disposed in the housing and a resonator bus disposed in the housing and coupled to the at least two qubits, wherein the at least two qubits are maintained at a fixed frequency and are statically coupled to one another via the resonator bus, wherein energy levels |03> and |12> are closely aligned, wherein a tuned microwave signal applied to the qubit activates a two-qubit phase interaction.

Additional exemplary embodiments include a microwave-activated controlled-phase gate system, including a housing, a resonator bus disposed in the housing, a first qubit disposed in the housing, a second qubit disposed in the housing and coupled to the first qubit via the resonator bus, wherein energy levels |03> and |12> are closely aligned, wherein a tuned microwave signal is applied to the system activates a two-qubit entangling gate.

Additional exemplary embodiments include a microwave-activated controlled-phase gate system, including a housing, a resonator bus disposed in the housing, a first qubit disposed in the housing, a second qubit disposed in the housing and coupled to the first qubit via the resonator bus, wherein the first and second qubits are transmon qubits.

Additional exemplary embodiments include a microwave-activated controlled-phase gate method, including coupling a first qubit to a second qubit via a resonator bus thereby generating a microwave-activated controlled-phase gate, wherein a |03> energy level is equal to a |12> energy level, tuning the microwave-activated controlled-phase gate, selecting a time Tgate by sweeping through a range of durations T and establishing a two-qubit coupled system via the microwave-activated controlled-phase gate.

Further exemplary embodiments include a microwave-activated controlled-phase gate method, including coupling a first qubit to a second qubit via a resonator bus wherein a |03> energy level is equal to a |12> energy level and applying a microwave drive signal in a cross-resonant manner to the first qubit, at a drive frequency approximately at the |1> to |2> transition of the second qubit, wherein the microwave drive signal is split in half with a $\pi$ pulse applied on the first and second qubits inserted in between the split microwave drive signal to remove additional phase errors.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
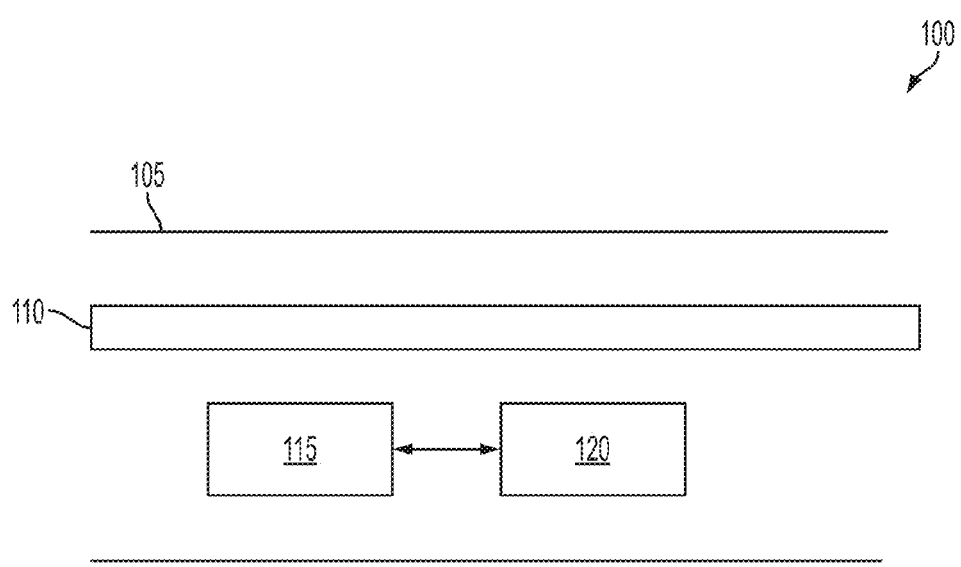
FIG. 1 illustrates an exemplary fixed-frequency entangling two-qubit gate system.

In exemplary embodiments, the systems and methods described herein include a fixed-frequency entangling two-qubit gate between two qubits, which are statically coupled via a microwave resonator bus. FIG. 1 illustrates an exemplary fixed-frequency entangling two-qubit gate system 100. FIG. 1 illustrates a simplified system level diagram to illustrate that numerous embodiments are contemplated. The system includes a housing 105 that can be any suitable superconducting or non-superconducting material including but not limited to aluminum (Al). The system 100 further includes a resonator 110 disposed within the housing 105. The system 100 further includes qubits 115, 120 coupled to one another, to the housing 105 and to the resonator 110. In exemplary embodiments, the qubits can be a transmon-style superconducting Josephson junction. A transmon qubit is a superconducting qubit that is made insensitive to charge by making the qubit capacitance large. By adjusting the capacitance and Josephson inductance (both are determined through fabrication and device geometry), the characteristic energies associated with the qubit capacitance ($E_c$) and qubit inductance (Ej) satisfy Ej>>Ec. It can be appreciated that other types of qubits are contemplated in other exemplary embodiments. It will be appreciated that the qubits 115, 120 can be any suitable qubit system, including, but not limited to: silicon-based nuclear spins, trapped ions, cavity quantum-electrodynamics, nuclear spins, electron spins in quantum dots, superconducting loops and Josephson junctions, liquid state NMR, and electrons suspended above the surface of liquid Helium.

In exemplary embodiments, as will be appreciated further herein, the system 100 includes several qualities. In exemplary embodiments, the system 100 includes an all-microwave control of the qubits 115, 120, which can be of fixed-frequency. The system 100 has appreciable qubit separation for high fidelity single-qubit gates and avoids leakage to higher levels, without sacrificing two-qubit gate speeds. The system 100 has the ability to function as a two-qubit phase gate. The system 100 is drivable via any line which addresses either of the two qubits 115, 120, including the coupling resonator drive line 110. Implementing the common resonator drive line 110 removes the need for on-chip explicit microwave drive lines for each qubit 115, 120, simplifying the circuit considerably.

Conventionally, for superconducting qubits, there have been a number of experimentally realized two qubit gates. Their function, implementation, advantages, and disadvantages are now described. In an ISWAP gate, two tunable superconducting qubits (i.e., split-pair Cooper pair box, flux-qubit, split-pair transmon, phase qubit) are explicitly coupled via a circuit element (capacitor, mutual inductor, common microwave resonator). The coupling interaction is effectively turned on through tuning the qubit energy levels via magnetic flux. In single qubit operation mode, the two qubit ground-to-excited-state energy levels are detuned from one another. The two qubit ISWAP gate involves dynamically tuning the two qubits into resonance with one another for an interaction time equal to the full swapping interaction between the two qubits. The ISWAP gate together with single qubit gates forms a universal set of gates, from which complex quantum circuits can be derived, and generates entangled states, such as Bell states. Advantages of the scheme are: 1) the ability to start off in a region where the qubits are very well decoupled, permitting good single qubit control; and 2) fast turn on of the interaction results in gate times which can be very short, i.e., 10-100 ns. Disadvantages of the scheme are: 1) the need for tunable superconducting qubits which can result in reduced coherence times due to flux noise either during the gate or in other operation regimes; 2) the presence of anharmonic energy levels of the qubit often make tuning frequencies around difficult as it may lead to unwanted transitions or higher level interactions; and 3) the need for on-chip fast flux bias lines with hundreds of MHz of bandwidth, which can result in additional circuit complexity inside the dilution refrigerator and control electronics.

Another conventional approach is the dynamic controlled-phase gate, in which two tunable superconducting qubits (i.e., split-pair transmon, capacitively-shunted flux-qubit, and phase qubit) are explicitly coupled via a circuit element (capacitor, mutual inductor, common microwave resonator). Similar to the dynamic ISWAP, the coupling interaction is effectively turned on through tuning the qubit energy levels via magnetic flux, although via a different resonance condition. In single qubit operation mode, the two qubit ground-to-excited-state energy levels are again detuned from one another. However, this two-qubit gate involves dynamically tuning the energy level of the |11> state (the state where both qubits are in their first-excited states we will use the notation |nm> to denote n excitations in qubit 1 and m excitations in qubit 2), into resonance with the |02> or |20> state (the states where one of the qubits are in the second-excited state and the other qubit is in the ground state). This tuning is performed again via magnetic flux, and can be either done slowly (adiabatically), or fast, with the only constraint of picking up exactly a 180 degree phase shift on the |11> state. This technique can be calibrated and tuned up via simple Ramsey-fringe like experiments. Advantages of the scheme are: 1) the ability to start off in a region where the qubits are very well decoupled, permitting good single qubit control; 2) fast turn on of the interaction results in gate times which can be very short, i.e. 10-100 ns; and 3) as a two-qubit phase gate, likely residual errors are single-qubit phase errors, which are easily mitigated with spin-echo like sequences. Disadvantages of the scheme are: 1) the need for tunable superconducting qubits which can result in reduced coherence times due to flux noise either during the gate or in other operation regimes; 2) although this gate explicitly relies on anharmonic energy levels, the presence of other energy levels of the qubit can still make tuning frequencies around unwieldy as it may lead to unwanted transitions or higher level interactions; 3) the need for on-chip fast flux bias lines with hundreds of MHz of bandwidth, which can result in additional circuit complexity inside the dilution refrigerator and control electronics; and 4) in the non-adiabatic protocol, the flux-bias must be done very fast, but not too fast due to higher level leakage, making the control difficult and in some cases impossible.

Another conventional approach is the fixed frequency sideband gate in which two superconducting qubits, which can be either tunable or fixed-frequency, are explicitly coupled via a common microwave quantum bus resonator. The scheme requires locating the blue sideband transition, corresponding to the transition between the |0, n=0>, where the qubit is in the ground state and there are no photons in the resonator, and the |1, n=1>, where the qubit is in the excited state and 1 photon in the resonator. This transition can be driven via a two-photon process directly on each of the qubits and must be found for both qubits. The entangling gate, which also amounts to a combination of these sideband pulses into a CNOT, is performed with five sideband pulses and several single qubit gates. Advantages of the scheme are: 1) the ability to use fixed frequency qubits, such as single junction transmons, or flux qubits biased to their symmetry points where coherence times can be optimized; and 2) all microwave control means that two-qubit gates can be built and controlled with the same hardware as used for single qubit gates. Disadvantages of the scheme are: 1) the use of transitions which involve directly populating the resonator results in additional decay channels during the gate; 2) for faster gate times (in the <100 ns range), the qubits must be pretty strongly coupled to the resonator, which can result in higher Purcell-limited relaxation rates and 3) requires on-chip explicit microwave drive lines for each qubit, which can lead to additional crosstalk issues for different microwave signals.

Another conventional approach is the fixed frequency cross resonance gate, in which two superconducting qubits (A and B), which can be either tunable or fixed-frequency, are explicitly coupled via a circuit element (capacitor, mutual inductor, common microwave quantum bus resonator). Each qubit has its own microwave drive line. The two qubits are operated in a regime such that there is a non-trivially small residual two-qubit direct coupling interaction, J_eff, but separated in frequency enough to permit high-fidelity single-qubit operations. In the case of direct capacitive coupling or via a bus resonator, J_eff is largest when both qubits are near resonant to one another, yet this arrangement can be detrimental for performing single qubit gates. The two-qubit gate, which generates a controlled-NOT gate, is performed by driving qubit A at qubit B's ground-to-excited state transition frequency. In this scheme, qubit A serves as a control and qubit B serves as the target qubit. The interaction can be observed by applying a single-qubit pi/2 excitation to qubit B, and turning on the cross-resonance microwave drive, with the control qubit A in either its ground or excited state. The difference in oscillations from the two experiments gives the interaction strength and a half period oscillation results in a controlled-NOT gate. Advantages of the scheme are: 1) the ability to use fixed frequency qubits, such as single junction transmons, or flux qubits biased to their symmetry points where coherence times can be optimized; 2) all microwave control means that two-qubit gates can be built and controlled with the same hardware as used for single qubit gates; 3) simple scalable scheme for more qubits; and 4) ability to couple non-nearest frequency neighboring qubits. Disadvantages of the scheme are: 1) gate times can be slow (~100 to 500 ns) when qubits are parked at frequency locations where high fidelity single qubit gates are also permitted; and 2) requires on-chip explicit microwave drive lines for each qubit, which can lead to additional crosstalk issues for different microwave signals.

In exemplary embodiments, the systems and methods described herein rely on the presence of the higher levels of the two qubits, but unlike the dynamic c-Phase gate, does not require a resonance condition between higher levels and computational states (i.e., |00>, |01>, |10>, or |11>). Rather, by careful control over the design of the qubits 115, 120 (i.e., controlling qubit capacitance and Josephson junction critical current), it is possible to tailor the two different qubit energy levels to experience a resonance condition involving only higher level non-computational states.

Figure 2:
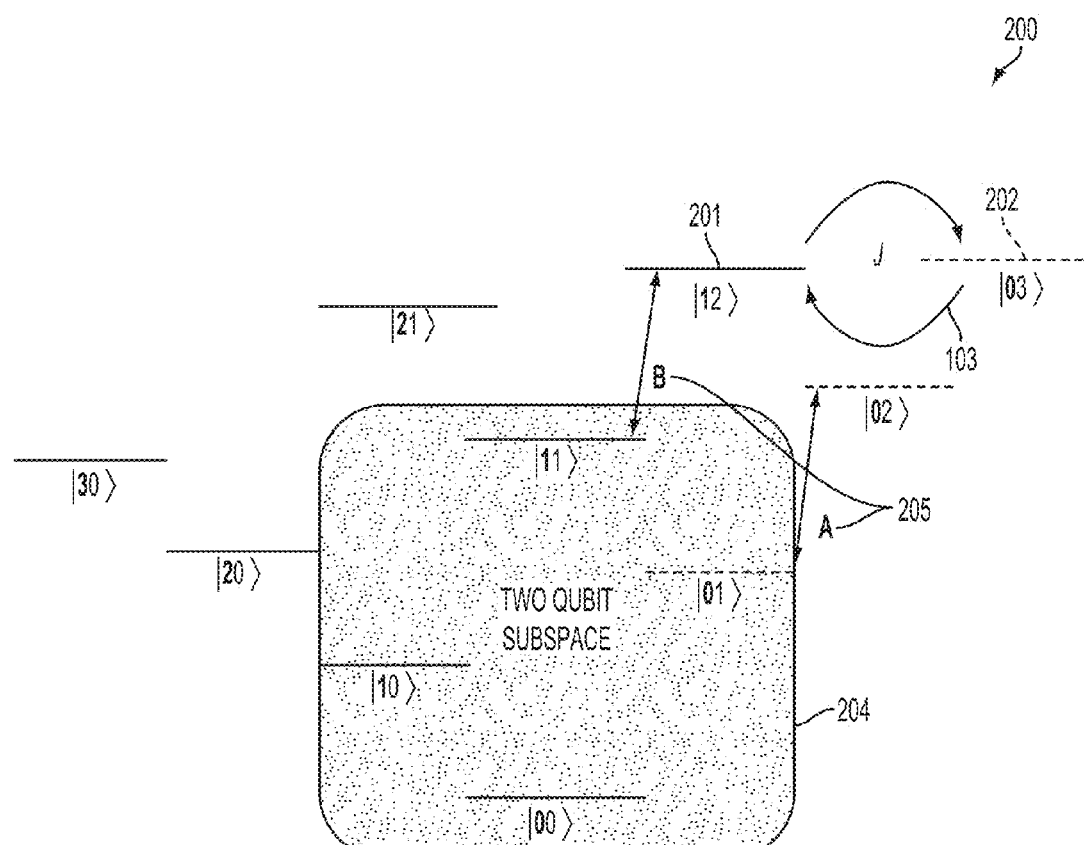
FIG. 2 illustrates an exemplary energy level diagram.

FIG. 2 illustrates an exemplary energy level diagram 100 corresponding to the microwave-activated controlled phase (MAP) gate on two multi-level superconducting qubits (e.g., in system 100 of FIG. 1), generated by having the two-qubit levels |12>, 101, and |03>, 102, aligned or close to being aligned. When the energy levels 101, 102 are degenerate or close to degenerate, there can be an interaction 103 with strength J. The interaction 103 serves to make the energy differences A and B (labeled 105) different, which results in a phase gate on the two-qubit subspace 204 basis state |11> when a microwave tone near the frequency of A or B transition is applied to the system 100, which generates a two-qubit c-Phase gate. As such, FIG. 2 illustrates an example design configuration that aligns the energy corresponding to |03> with the energy corresponding to |12>. Neither of these states are computational states for the two qubits, which means that the presence of this fixed higher order coupling does nothing to the qubits in the idle state. However, a two qubit interaction is turned on when driving the system near the frequency corresponding to the transition from |01> to |02> (f_12 for qubit 2), as the amount of phase picked up when the qubit is in the |11> state differs from when in any of the other states as a result of the difference in energy between |12> and |11> being different from |02> and |01>. When the difference in phase is equal to $\pi$, then a controlled-Phase gate has been performed. The gate is an entirely microwave-activated controlled-Phase (MAP) gate, and two-qubit interactions are only experienced when the appropriate microwave radiation is applied. Furthermore, this microwave-control can be applied onto either qubit (if each qubit had a corresponding control line), or the cavity which couples them.

The ac-stark effect is a shift of the energy levels of a system by the presence of an external drive with amplitude $\Omega$. The level shifts by an amount equal to the power of the external drive ($\Omega^2$) divided by the difference in the level transition frequency ($\omega+\delta n$) and the drive frequency $\omega_d$. The anharmonicity of the qubit system 100 is represented by $\delta$. For a superconducting qubit (or equivalent Duffing oscillator type system) the $n^{th}$ energy level shifts according to:

$$E_n = -\frac{(n+1)\Omega^2}{4(\omega+\delta n - \omega_d)} + \frac{(n)\Omega^2}{4(\omega+\delta(n-1)-\omega_d)}, \quad \text{EQ. 1}$$

which results in a phase shift in the qubit space of the form:

$$\delta\phi = E_0 - E_1 = -\frac{\Omega^2}{2(\omega-\omega_d)} + \frac{\Omega^2}{2(\omega+\delta-\omega_d)}. \quad \text{EQ. 2}$$

From the expression, EQ. 2, this shift can be controlled by changing the effective anharmonicity of the qubit. If this can be done conditioned on the state of another qubit, then a conditional phase gate is achieved. In the case when the |12> level is brought into resonance with the |03> level, then the qubit frequency remains unaffected. However these two levels have an avoided crossing and the effective anharmonicity of the second qubit is changed according to $\delta \rightarrow \delta \rightarrow \zeta$, where:

$$\zeta = \frac{1}{2}\left(\sqrt{12J^2 + (\Delta+2\delta_2)^2} - \Delta - 2\delta_2\right) \quad \text{EQ. 3}$$

and $\Delta$ is the detuning between the two qubits. EQ. 3 has a maximum when the detuning between the qubits is equal to negative of twice the anharmonicity of the second qubit and at this operational point the difference between the phase conditioned on the first qubit state gives the rate of the MAP gate:

$$\delta\phi_{zz} = \delta\phi_0 - \delta\phi_1 \approx \frac{\zeta\Omega^2}{2(\omega+\delta-\omega_d)^2}. \quad \text{EQ. 4}$$

For typical values of J, EQ. 4 can have a gate time in the 100 ns-1 $\mu$s range. It can be made faster via pulse shaping and has a fundamental limit which for typical values can be as short as a few tens of nanoseconds.

In exemplary embodiments, a modification to the gate can be made by applying the drive which is at the 1 to 2 transition of the second qubit directly to the first qubit. This is reminiscent of the cross-resonance scheme, but still provides a conditional phase effect achieved from the difference in the anharmonicity, but permits a reduction of direct leakage out of the second qubit's energy subspace via the indirect driving.

Another variant of the gate is to split the total gate time into two halves, and inserting a $\pi$ pulse onto both qubits in between. This pulse insertion serves to refocus the dynamical single-qubit phases, which are picked up by the qubits as the action of the MAP gate results in an off-resonant ac-Stark drive from both qubits. This echoed sequence makes the tune-up of a c-Phase unitary gate much simpler, without the need of applying any other additional single-qubit gates to compensate.

Figure 3:
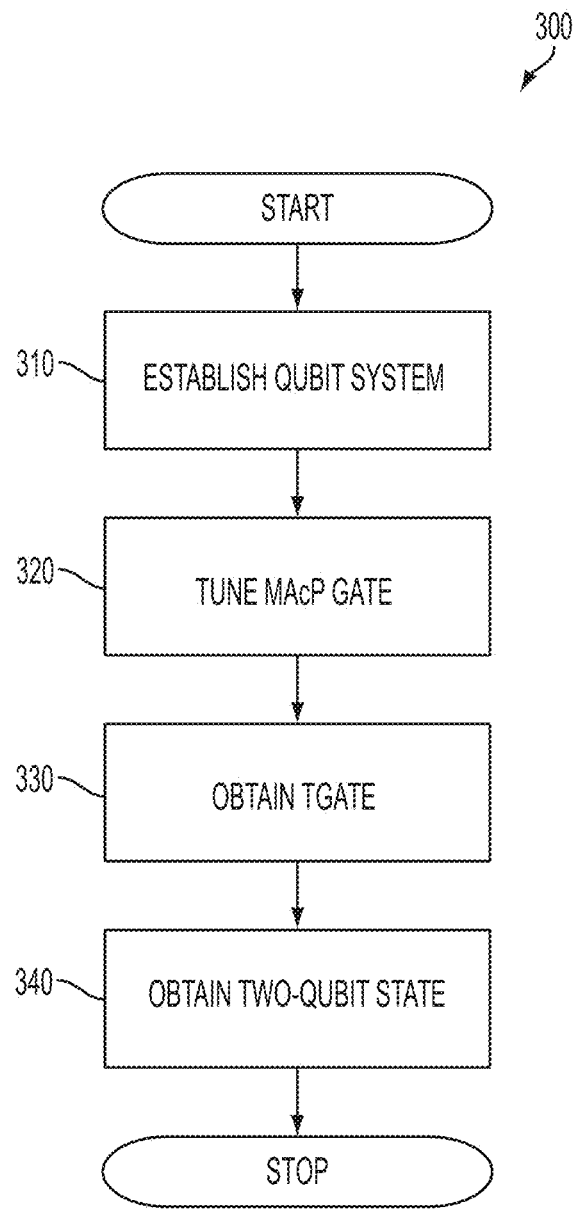
FIG. 3 illustrates a flow chart of a method of tuning and operating an exemplary fixed-frequency entangling two-qubit gate system in accordance with exemplary embodiments.

FIG. 3 illustrates a flowchart of a method 300 of tuning and operating an exemplary fixed-frequency entangling two-qubit gate system (e.g., the system 100 of FIG. 1) in accordance with exemplary embodiments.

Although the overall microwave activated controlled-phase gate can be rather general, as described above, the following is an implementation protocol for tuning up the situation where transmon qubits have been intentionally designed to have |03> align with |12>.

At block 310, the system 100 is established. In exemplary embodiments, the system 100 is designed such that for two transmon qubits, the |03> energy level is equal to the |12> energy level. Assuming that both qubits are designed to have the same anharmonicity Ec, this condition is best achieved by aiming for the |10> transition frequency to be 2Ec detuned from the |01> transition frequency.

Figure 4:
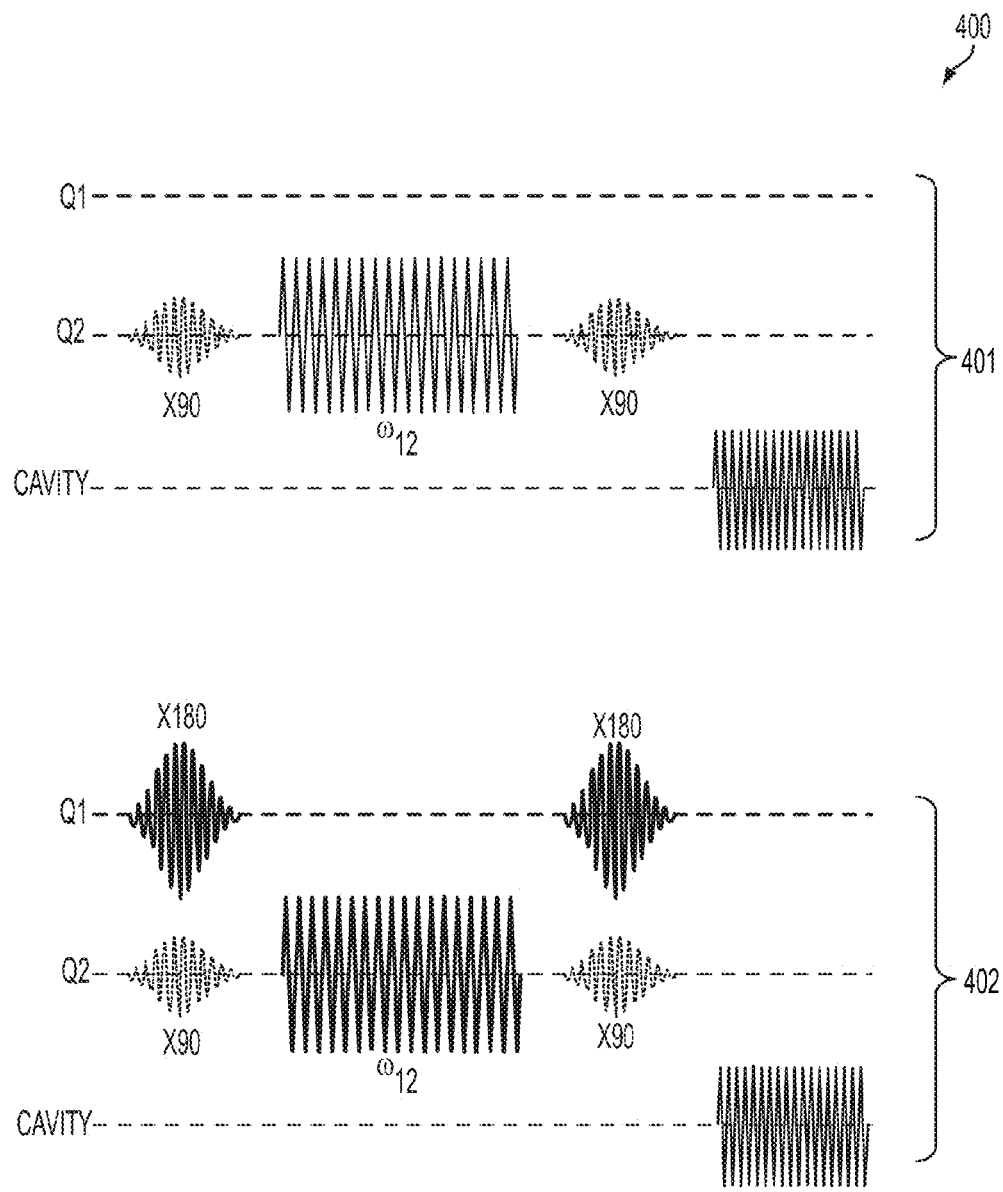
FIG. 4 depicts a protocol for determining a MAP gate time.

At block 320, the MAP gate is tuned up by applying the pulse scheme shown in FIG. 4, which depicts a protocol 400 for determining the optimal MAP gate time. In each of the experiments 401, and 402, the sequences are comprised of π/2 pulses applied to a second qubit, sandwiching the microwave drive at frequency w12, which should be close to the |1> to |2> transition of the second qubit. These experiments result in Ramsey-fringe like patterns, with the only difference being that 402 gives fringes given that a first qubit is in its excited state, and experiment 401 gives fringes given that the first qubit is in its ground state. The state of the first qubit between the two experiments 401, 402 is set either by doing nothing, or applying a π pulse. The time of the MAP pulse, t is varied, and an optimal gate time Tgate is determined for a specific drive strength A and at a specific microwave frequency w12, by when the fringes between the two experiments 401, 402 are exactly 180 degrees out of phase. Note that in this sequence of gates, the MAP gate can be applied directly to any of the qubits or on a common bus resonator drive.

In exemplary embodiments, with the first qubit in either its ground state |00> or excited state |10>, a 90 degree (π/2) pulse is first applied on the second qubit, followed by a microwave-tone at a frequency f near the f_12 for the second qubit, with amplitude A and duration T, and then post-pended by another 90 degree pulse on the second qubit. By choosing an f and A, and sweeping through a range of durations T, a fringing pattern (Ramsey-like experiment) will be observed, which will be different depending on the initial state of the first qubit. The point of T at which the fringes are exactly π out of phase corresponds to the MAP gate time Tgate.

Referring again to FIG. 3, at block 330, the Tgate is obtained for different f and A and optimized for shortness of duration and contrast of fringing pattern, giving f0 and A0.

At block 340, any two-qubit state is obtained. In exemplary embodiments, given f0, A0, and Tgate defines the MAP gate, which can now be used in conjunction with single-qubit gates on both qubits to make any two-qubit state.

Figure 5:
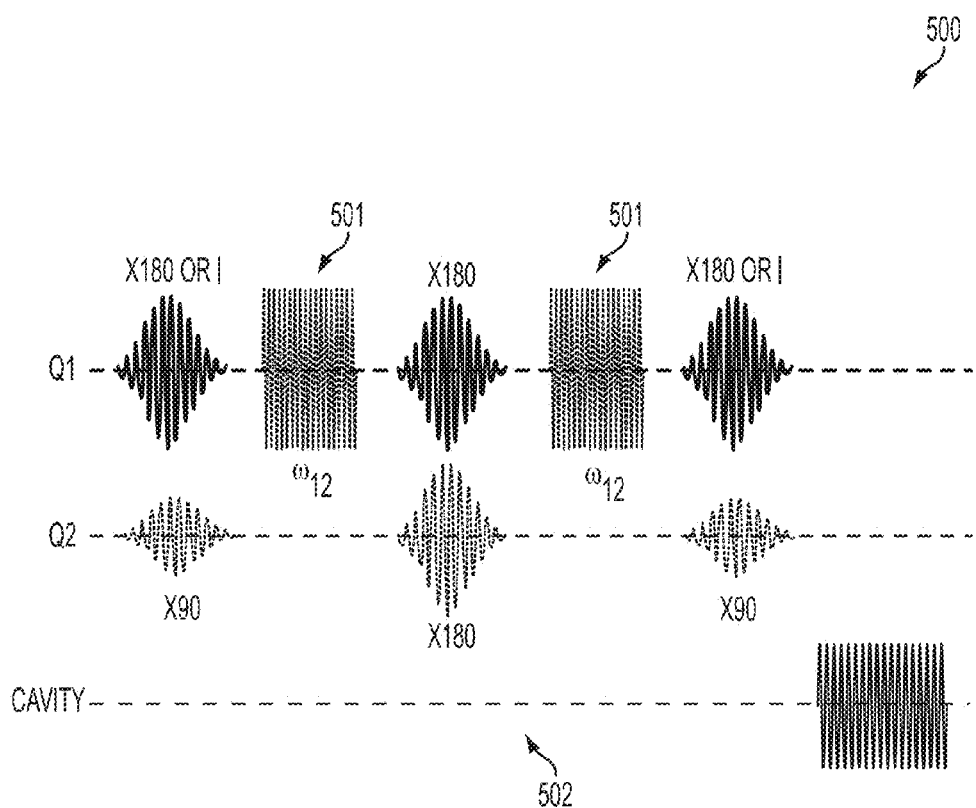
FIG. 5 depicts a slight variant of the MAP gate time of FIG. 4.

FIG. 5 depicts a slight variant of the gate, in which the MAP gate (near resonant with |1> to |2> of qubit 2) is actually split into two sections 501 and interrupted by pi pulses applied to both qubits 502, and is also applied in a cross-resonant fashion, onto the first qubit. The π pulses between the two halves of the MAP gate serve to refocus and residual single-qubit Z gates on either qubit. These echo-like sequences make tune-up of the c-Phase gate less complicated.

Figure 6:
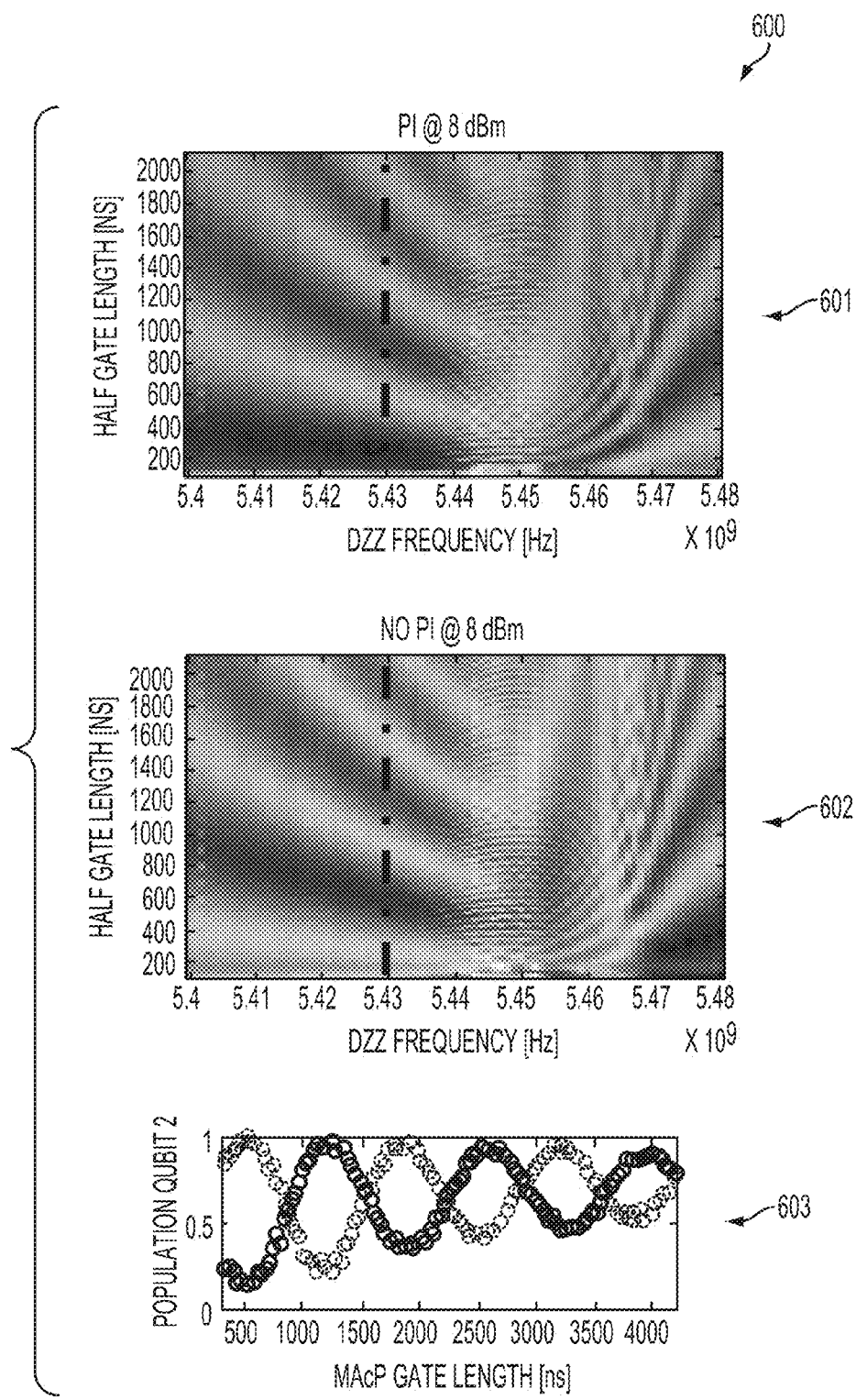
FIG. 6 shows the data corresponding to the MAP interaction tune-up for a pair of qubits.

FIG. 6 shows the data corresponding to the MAP interaction tune-up for a pair of qubits, which experience an interaction between the |12> and |03> energy levels. 601 and 602 show the result of applying the pulse sequence of FIG. 5, while varying the frequency w12 and length of the MAP gate. Fringes are observed in both cases, with level 601 being the case with qubit 1 starting in its excited state, and level 602 being the case with the first qubit starting in its ground state. A slice through at the frequency 5.43 GHz gives the traces shown in 603, where a gate time can be found at 517 ns.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A device, comprising:
  a housing;
  at least two qubits disposed in the housing; and
  a resonator disposed in the housing and coupled to the at least two qubits,
  wherein the at least two qubits are maintained at a fixed frequency and are statically coupled to one another via the resonator,
  wherein energy levels |03> and |12> are closely aligned,
  wherein a tuned microwave signal applied to the qubit activates a two-qubit phase interaction.

2. The device as claimed in claim 1 wherein the at least two qubits are controlled via microwaves from the resonator.

3. The device as claimed in claim 1 wherein the tuned microwave signal corresponds to a frequency difference of energy levels |01> and |02>.

4. The device as claimed in claim 1 wherein the at least two qubits interact via a microwave-activated controlled-Phase (MAP) gate.

5. The device as claimed in claim 4 wherein a microwave activated phase is generated when a two-qubit |11> state differs from a sum of |01> and |10> states due to the tuned microwave signal.

6. The device as claimed in claim 5 wherein the energy difference between |12> and |11>, differs from |02> and |01> when the tuned microwave signal is applied.

7. The device as claimed in claim 6 wherein in response to a difference in phase being equal to $\pi$, a controlled-phase gate is performed.

8. The device as claimed in claim 1 wherein each of the at least two qubits is a transmon qubit.

9. A microwave-activated controlled-phase (MAP) gate system, comprising:
   a housing;
   a resonator disposed in the housing;
   a first qubit disposed in the housing; and
   a second qubit disposed in the housing and coupled to the first qubit via the resonator,
   wherein energy levels |03> and |12> are closely aligned;
   wherein a tuned microwave signal is applied to the qubit activates a two-qubit phase interaction.

10. The system as claimed in claim 9 wherein the coupling between the at least two qubits is activated by a microwave drive at a transition frequency.

11. The system as claimed in claim 10 wherein the applied microwave drive frequency corresponds to a transition from |01> to |02>.

12. A microwave-activated controlled-phase (MAP) gate system, comprising:
   a housing;
   a resonator disposed in the housing;
   a first qubit disposed in the housing; and
   a second qubit disposed in the housing and coupled to the first qubit via the resonator drive line,
   wherein the first and second qubits are transmon qubits.

13. The system as claimed in claim 12 wherein a |03> energy level is equal to a |12> energy level.

14. The system as claimed in claim 13 wherein the first qubit is in at least one of a ground state |00> and excited state |10>.

15. The system as claimed in claim 14 wherein a $\pi/2$ microwave pulse is applied to the second qubit followed by a microwave drive at the frequency corresponding to a transition from |01> to |02>.

16. The system as claimed in claim 15 wherein in response to the microwave drive applied, when a difference in phase on the second qubit being equal to $\pi$ between when the first qubit is in |00> or |10>, a controlled-phase gate is performed.

* * * * *